(12) United States Patent
Mitsuo

(10) Patent No.: US 7,208,926 B2
(45) Date of Patent: Apr. 24, 2007

(54) SWITCHING SIGNAL MODULATION CIRCUIT

(75) Inventor: Nakada Mitsuo, Toyama (JP)

(73) Assignee: Cosel Co., Ltd., Toyama (JP)

( * ) Notice: Subject to any disclaimer, the term of this patent is extended or adjusted under 35 U.S.C. 154(b) by 346 days.

(21) Appl. No.: 10/989,465

(22) Filed: Nov. 17, 2004

(65) Prior Publication Data

US 2005/0110473 A1    May 26, 2005

(30) Foreign Application Priority Data

Nov. 20, 2003   (JP)   ............................. 2003-390421

(51) Int. Cl.
  G05F 1/40   (2006.01)
  H02M 3/335  (2006.01)
  H02H 7/00   (2006.01)
(52) U.S. Cl. .................. 323/282; 323/271; 363/21.01
(58) Field of Classification Search ............... 323/268, 323/271, 273, 275, 279, 282, 285; 363/16, 363/21.01, 21.04, 21.1, 21.18, 40, 41
  See application file for complete search history.

(56) References Cited

U.S. PATENT DOCUMENTS 4,420,804 A * 12/1983 Nishino .................. 363/21.04
5,640,315 A *  6/1997 Hirano et al. ............. 363/41
6,051,960 A *  4/2000 Ito et al. .................. 323/222
6,580,253 B2 * 6/2003 Kanakubo et al. ......... 323/222
6,914,419 B2 * 7/2005 Katayama ................. 323/225
2004/0263140 A1* 12/2004 Adragna et al. ........... 323/282

* cited by examiner

Primary Examiner—Matthew V. Nguyen
(74) Attorney, Agent, or Firm—Wenderoth, Lind & Ponack, L.L.P.

(57) ABSTRACT

A switching signal modulation circuit includes a switching control circuit having an ON time control terminal and an OFF time control terminal, the switching control circuit capable of adjusting respectively separately ON time and OFF time of a switching signal using values of resistors externally attached respectively to the ON time control terminal and the OFF time control terminal; a spread signal generating circuit operable to output a spread signal; an ON time setting resistor connected between the ground and the ON time control terminal of the switching control circuit; an OFF time setting resistor connected between the ground and the OFF time control terminal of the switching control circuit; a first weight resistor operable to vary the frequency and the duty of the switching signal, the first weight resistor connected between an output of the spread signal generating circuit and the ON time control terminal of the switching control circuit; and a second weight resistor operable to vary the frequency and the duty of the switching signal, the second weight resistor connected between the output of the spread signal generating circuit and the OFF time control terminal of the switching control circuit.

3 Claims, 3 Drawing Sheets

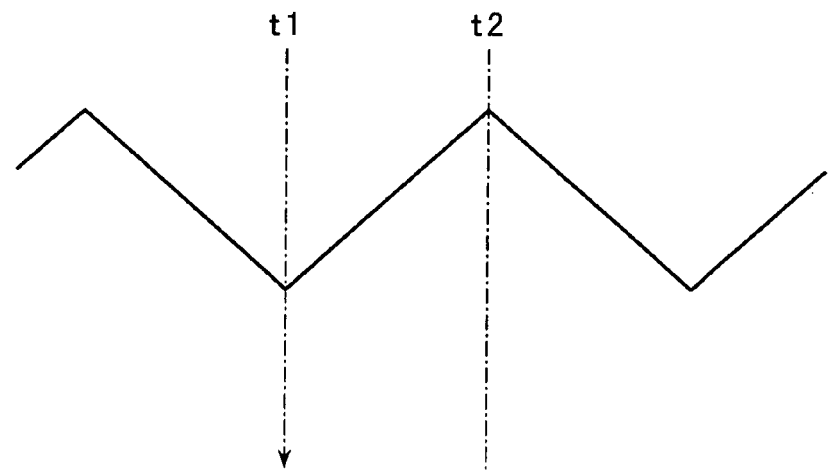
FIG. 3A
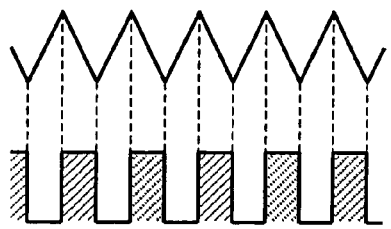
FIG. 3B
FIG. 3C
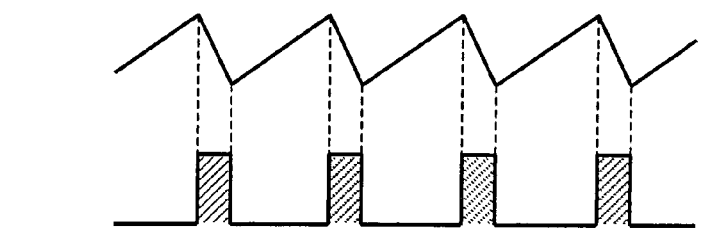
FIG. 3D
FIG. 3E

SWITCHING SIGNAL MODULATION CIRCUIT

BACKGROUND OF THE INVENTION

1. Field of the Invention

The present invention relates generally to a switching signal modulating circuit for use in switching control of a switching regulator, etc., and more particularly, to a switching signal modulating circuit that varies randomly the frequency and the duty of a switching signal using a spread signal.

2. Description of the Related Art

Conventionally, a switching regulator is adapted to produce a control signal for frequency modulation of a triangular wave signal generating circuit by detecting the maximal value of a triangular wave signal and sampling a random signal at the timing of the detected maximal value in order to reduce the peak levels of the conduction noise and the radiation noise accompanied by switching control, is adapted to obtain a PMW signal by varying randomly the triangular signal by a spread width of 0.8 to 1.2 times as wide as that of the central frequency and by comparing this triangular signal with a reference voltage using a comparator and is adapted to control the turning on and off of a switching device (see, e.g., Japanese Patent Application Laid-Open Publication Nos. 1995-264849 and 2003-274656).

However, such a conventional switching signal modulating circuit as above needs a peak detecting circuit and a sample holding circuit and has a problem that a transformer is saturated because the width of an ON time period is increased when the switching frequency is lowered due to the frequency spread. Furthermore, as to the above switching signal modulating circuit, the circuitry is complicated, designing of the logic and adjustment take time and the control circuit becomes bulky. To use a dedicated IC can be considered in order to solve the problems. However, this needs much time to deliver and a higher cost. In addition, other problems also arise that the scope of the designing to reduce the spread frequency is limited by the restriction on the size of the transformer, etc.

SUMMARY OF THE INVENTION

According to the present invention there is provided a switching signal modulating circuit used for PWM control that facilitates the reduction of noise by the spectrum spread, at a low cost, using a combination of multi-purpose ICs without requiring any specific circuits and parts. The present invention is configured as follows. A switching signal modulation circuit of the present invention comprises a switching control circuit having an ON time control terminal and an OFF time control terminal, the switching control circuit capable of adjusting respectively separately ON time and OFF time of a switching signal using resistance values of resistors externally attached respectively to the ON time control terminal and the OFF time control terminal; a spread signal generating circuit operable to output a spread signal; an ON time setting resistor connected between the ground and the ON time control terminal of the switching control circuit; an OFF time setting resistor connected between the ground and the OFF time control terminal of the switching control circuit; a first weight resistor operable to vary the frequency and the duty of the switching signal, the first weight resistor connected between an output of the spread signal generating circuit and the ON time control terminal of the switching control circuit; and a second weight resistor operable to vary the frequency and the duty of the switching signal, the second weight resistor connected between the output of the spread signal generating circuit and the OFF time control terminal of the switching control circuit.

The spread width of the frequency of the switching signal is determined by the ratio of the resistance value of the first weight resistor R1 for varying the frequency and duty to that of the ON time setting resistor or by the ratio of the resistance value of the second weight resistor to that of the OFF time setting resistor, and the variation rate of the duty of the switching signal is determined by the ratio of the resistance value of the first weight resistor R1 to that of the second weight resistor. The switching control circuit of the present invention controls turning on and off of a switching device of a switching regulator.

The switching signal modulating circuit of the present invention uses a multi-purpose IC for PWM control such as, for example, M5199 from Mitsubishi Electric Corp., etc. as the switching control circuit and a multi-purpose timer IC such as, for example, NE555 from Signetics Co., Ltd., as the spread signal generating circuit, and determines the ON time period and the OFF time period by connecting the external resistors respectively with an ON time period control terminal and OFF time period control terminal of the switching control circuit as well as can apply a stable frequency spread having no hunting to the switching signal using a simple configuration of connecting the resistors for varying the frequency and the duty respectively between the output of the spread signal generating circuit and the ON time period control terminal, and the output of the spread signal generating circuit and the OFF time period control terminal. Furthermore, because it is not necessary to prevent the saturation of the transformer due to the spectrum spread and take a large allowance for saturation flux density, the noise can be reduced even with a small-sized transformer without making the transformer larger to reduce the noise. Yet furthermore, the duty ratio can be determined appropriately only by changing the ratios of the ON time period setting resistor and the OFF time period setting resistor in response to the spread width of the switching frequency and an inverter can be prevented from being broken by the saturation of the transformer, by reducing the duty for ON state when the switching frequency is lowered by the spread signal. In addition, because a stable and low-cost circuit can be provided and multi-purpose parts can be used, no problem concerning delivery arises. The above and other objects, features and advantages of the present invention will become more apparent from the following detailed description with reference to the drawings.

BRIEF DESCRIPTION OF THE DRAWINGS

FIG. 3A to FIG. 3E are signal waveform diagrams of triangular wave oscillation signals to a lump signal as a spread signal of FIG. 1.

DETAILED DESCRIPTION OF THE PREFERRED EMBODIMENT

Figure 1:
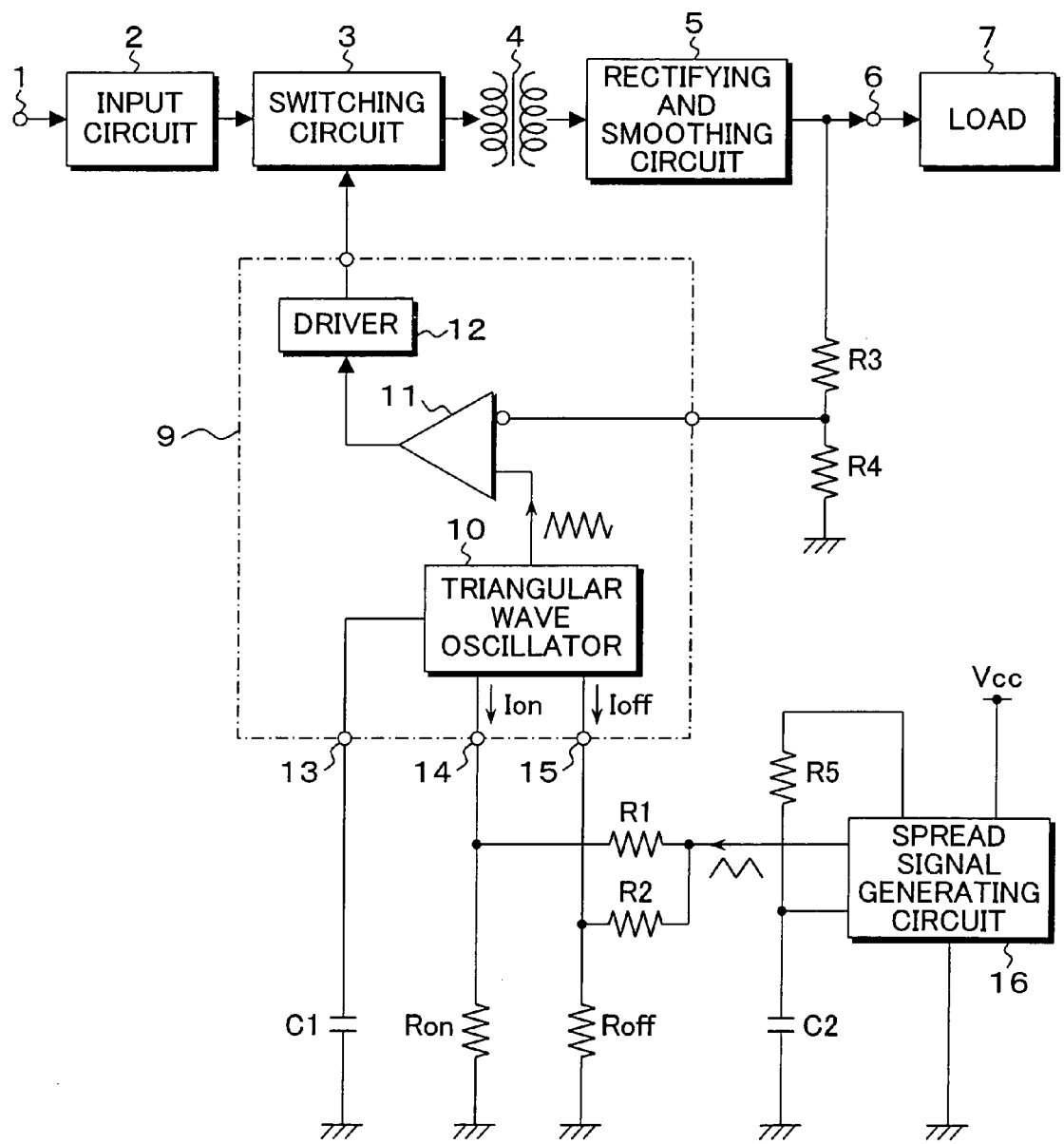
FIG. 1 is a circuit diagram of a switching regulator provided with a switching signal modulating circuit of the present invention.

FIG. 1 is a circuit block diagram showing an embodiment of the present invention taking a example of a switching regulator. In FIG. 1, the main circuit of the switching regulator comprises an input terminal 1, an input circuit 2, a switching circuit 3, a transformer 4, a rectifying and smoothing circuit 5 and an output terminal 6, and supplies a constant DC power voltage to a load 7. The input circuit 1 is provided with a rectifying circuit and a smoothing circuit if the input circuit is of an AC input type, and with an input smoothing capacitor if the input circuit is of a DC input type. The switching circuit 3 constitutes an inverter by connecting in series a switching element such as a MOSFET, etc. with the primary coil of the transformer 4. The rectifying circuit 5 converts the output of the secondary coil of the transformer 4 into a DC by rectifying and smoothing the output. A switching control circuit 9 is disposed on the above main circuit of the switching regulator. The switching control circuit 9 comprises a triangular wave oscillator 10, a comparator 11 and a driver 12. An output voltage to the load 7 is divided by resistors R3 and R4 and is inputted into an inverting input terminal of the comparator 11. The comparator outputs a PWM signal having a variable pulse width, by comparing the above input with a triangular wave signal inputted into a non-inverting input terminal of the comparator 11, drives the turning on and off of a switching device of the switching circuit 3 through the driver 12 and stabilize an output voltage to a constant voltage. The triangular wave oscillator 10 has an oscillating capacitor terminal 13, an ON time period control terminal 14 and an OFF time period control terminal 15. A capacitor C1, an ON time period setting resistor $R_{on}$ and an OFF time period setting resistor $R_{off}$ are connected respectively between the above terminals and the ground. The oscillation waveform of the triangular wave oscillator 10 is a triangular wave signal. The slope of the ascending inclination of the triangular wave signal is determined by the product of the value of the ON time period setting resistor $R_{on}$ and the value of the capacitor C1 and the slope of the descending inclination of the triangular wave signal is determined by the product of the value of the OFF time period setting resistor $R_{off}$ and the value of the capacitor C1. That is, the charging current of the capacitor C1 is determined by an outflow current $I_{on}$ of the ON time period setting resistor $R_{on}$ and the discharging current of the capacitor C1 is determined by an outflow current $I_{off}$ of the ON time period setting resistor $R_{off}$. As an commercially available IC realizing the switching control circuit 9 for PWM provided with the triangular wave oscillator 10 to which the ON time period and the OFF time period of the triangular wave signal can be respectively set using such external resistors as above, for example, M5199 from Mitsubishi Electric Corp., FA5321 from Fuji Electric Co., Ltd., AN8091 from Matsushita Electric Industrial Co., Ltd., etc. can be listed. A spread signal generating circuit 16 is disposed on the triangular wave oscillator 10 of the switching control circuit 9. In this embodiment, as the spread signal generating circuit 16, NE555 from Signetics, etc. that is known as a multi-purpose timer IC is used and outputs a lump signal that varies at a constant cycle as a spread signal by externally connecting a resistor R5 and a capacitor C2. A first weight resistor R1 for varying the frequency and the duty is connected between an output of the spread signal generating circuit 16 and the ON time period control terminal 14 of the triangular wave oscillator 10 and a second weight resistor R2 for varying the frequency and the duty is connected between the output of the spread signal generating circuit 16 and the OFF time period control terminal 15 of the triangular wave oscillator 10. By applying the lump signal that varies cyclically as a spread signal respectively through the first and the second weight resistors R1 and R2, the outflow currents $I_{on}$ and $I_{off}$ that flow out respectively from the ON time period control terminal 14 and the OFF time period control terminal 15 are varied in response to the voltage level of the lump signal. Thereby, the frequency and the duty of the triangular wave signal oscillated by the triangular wave oscillator 10 are varied and, therefore, spread on the frequency axis of switching of the switching circuit 3 is executed. That is, the spread width ±Δf of the frequency of the switching signal is determined by the ratio ($R1/R_{on}$) of the value of the first weight resistor R1 for varying the frequency and the duty to the value of the ON time setting resistor, or the ratio ($R2/R_{off}$) of the value of the second weight resistor R2 for varying the frequency and the duty to the value of the OFF time setting resistor $R_{off}$. In addition, the variation rate of the duty of the switching signal is determined by the ratio (R1/R2) of the first weight resistor R1 to the second weight resistor.

Figure 2:
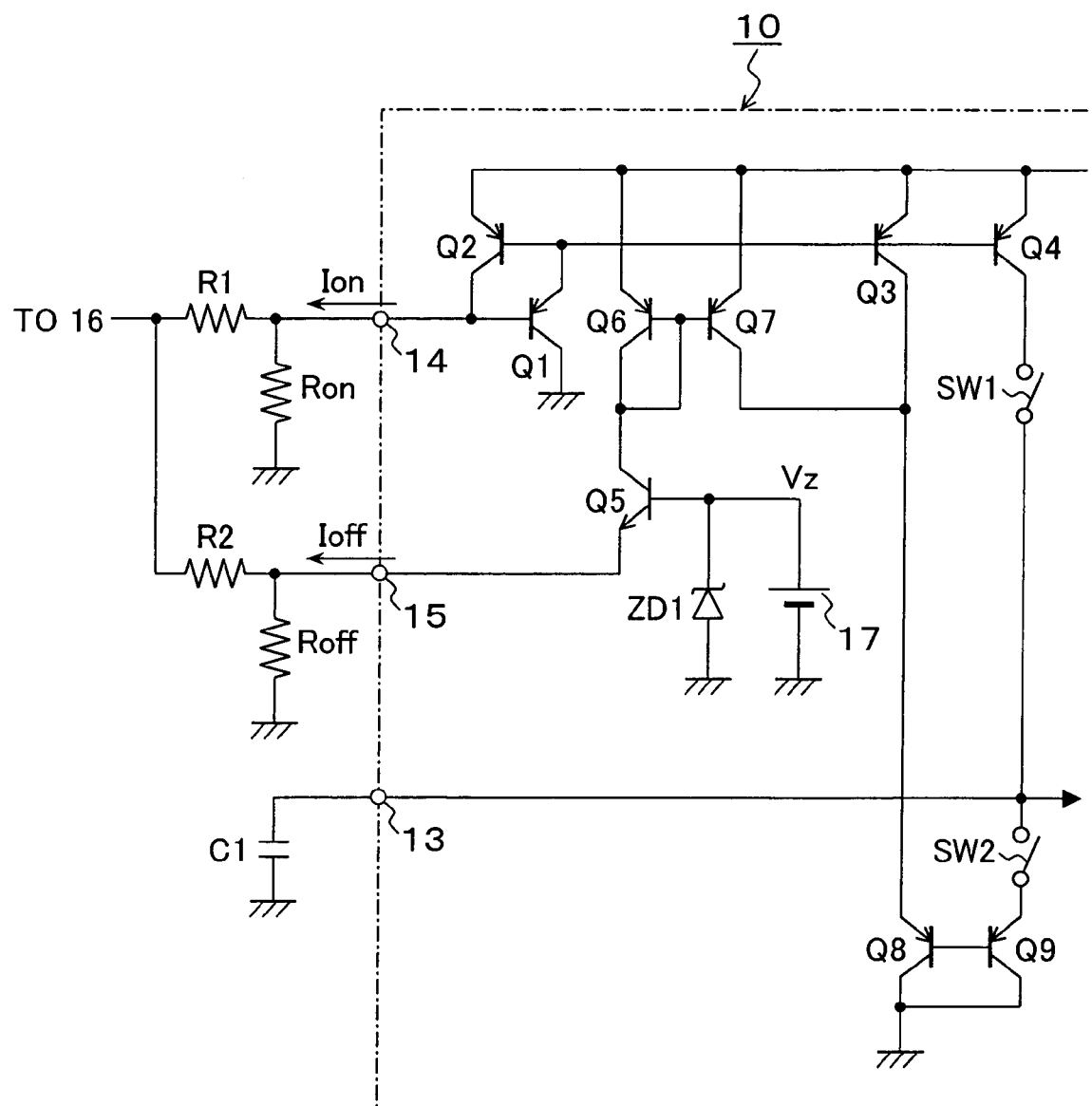
FIG. 2 is a circuit diagram of an embodiment of a triangular wave oscillator shown in FIG. 1.

FIG. 2 is an example of a detailed circuit of the triangular oscillator 10 of FIG. 1. In FIG. 2, the circuit portion on the charging side of the capacitor C1 is constituted of transistors Q1, Q2, Q3, Q4 and a switch SW1. The charge time constant of the capacitor C1 is determined by the outflow current $I_{on}$ that is determined in response to a voltage level of the spread signal at the moment applied through the ON time period setting resistor $R_{on}$ and the first weight resistor R1 connected with the ON time period control terminal 14. The circuit portion on the discharging side of the capacitor C1 is constituted of transistors Q5, Q6, Q7, Q8, Q9 and a switch SW2. The discharge time constant of the capacitor C1 is determined by the outflow current $I_{off}$ that is determined in response to a voltage level of the spread signal at each moment applied through the OFF time period resistor $R_{off}$ and the second weight resistor R2 connected with the OFF time period control terminal 15. The switches SW1 and SW2 are switching devices controlled in response to the charging time period and the discharging time period of the triangular wave signal and are controlled by a control circuit not shown such that the switch SW1 is turned on and the switch SW2 is turned off during the charging time period and, to the contrary, the switch SW1 is turned off and the switch SW2 is turned on during the discharging time period.

Referring again to FIG. 1, as an detailed example of the present invention, it is assumed that the central frequency of the switching is 300 kHz and the spread width is ±30 kHz that is taken to be ±10% of the central frequency. Therefore, the outflow current $I_{on}$ is varied by approximately 10% by setting the value of the first weight resistor R1 at a value approximately ten (10) times as large as the value of the ON time period setting resistor $R_{on}$. In addition, the outflow current $I_{on}$ is varied by approximately 10% by setting the value of the second weight resistor R2 at a value approximately ten (10) times as large as the value of the OFF time period setting resistor $R_{on}$. The values of the resistors and the varied amount of the currents have relations that, when the value of the first weight resistor R1 is set at a value approximately five (5) times as large as the value of the ON time period setting resistor $R_{on}$, the outflow current $I_{on}$ can be varied by approximately 20% and, when the value of the second weight resistor R2 is set at a value approximately five (5) times as large as the value of the OFF time period setting resistor $R_{on}$, the outflow current $I_{on}$ can be varied by approximately 20%. When the spread width is expanded, the transformer 4 becomes saturated and the noise reduction effect is also saturated. Therefore, the spread width is preferably approximately ±10%.

Next, operation of the embodiment of FIG. 1 will be described referring to signal waveform diagrams of FIGS.

3A to 3E. The spread signal generating circuit 16 outputs a lump signal shown in FIG. 3A as a spread signal. The cycle of this lump signal is a frequency that is low enough against the switching frequency. At a timing of a time t1 at which the voltage of the lump signal is minimal, currents flowing through the first and the second weight resistors R1 and R2 become maximal. Therefore, the outflow currents $I_{on}$ and $I_{off}$ from the ON time period control terminal 14 and an OFF time period control terminal 15 of the triangular wave oscillator 10 become maximal and, accordingly, the charge time and the discharge time of the capacitor C1 become shorter and, therefore, a triangular wave signal of FIG. 3B, for example, is oscillated. At this time, the ON duty represented by diagonally shaded areas of a signal (the control signal for the switches SW1 and SW2 of FIG. 2) for controlling the charge time and the discharge time of FIG. 3C is maximal. The triangular wave signal of FIG. 3B is inputted into the comparator 11, is compared with a partial voltage that is proportional to the output voltage at the moment, is converted into a PWM signal and turns on or off the switching device of the switching circuit 3 through the driver 12. On the other hand, at a timing of a time t2 at which the voltage of the lump signal is maximal, the currents flowing through the first and the second weight resistors R1 and R2 become minimal. Therefore, the outflow currents $I_{on}$ and $I_{off}$ from the ON time period control terminal 14 and an OFF time period control terminal 15 of the triangular wave oscillator 10 become minimal and, accordingly, the charge time and the discharge time of the capacitor C1 are increased and, therefore, a triangular wave signal of FIG. 3D of a lower frequency, for example, is oscillated. At this time, the ON duty represented by diagonally shaded areas of a signal for controlling the charge time and the discharge time of FIG. 3E is minimal. However, the ON time width is almost not varied. The ON time width is not increased even when the frequency of the triangular wave signal is lowered as described above. Therefore, as to the triangular wave signal of FIG. 3B, the ON time width is not increased for a PWM signal obtained by inputting the triangular wave signal of FIG. 3B into the comparator 11 and comparing the signal with the partial voltage that is proportional to the output voltage at the moment and, therefore, the transformer 4 is not saturated even when the switching frequency is lowered by the spread control. Surely, at timings other than the time t1 t2, a triangular wave signal with a spread width and a duty that depend on the voltage level of the lump signal at the moment is oscillated. In the above embodiment, the case is taken as an example where the spread signal generating circuit generates the lump signal. However, the signal may surely be a sine wave signal or a random wave signal. Moreover, though the above embodiment takes an example of the case where multi-purpose ICs are combined for the switching control circuit 9 and the spread signal generating circuit 16, the switching control circuit 9 and the spread signal generating circuit 16 may be a single IC which integrates the circuits 9 and 16 and to which the ON time period setting resistor $R_{on}$, the OFF time period setting resistor $R_{off}$, the first and the second weight resistors R1 and R2 are externally attached. Furthermore, though the above embodiment takes an example of a switching regulator, the present invention is not limited to the embodiment and can be applied to a power converting circuit employing PWM control for any circuit scheme. The invention encompasses any appropriate variations thereof without impairing the object and the advantages thereof and, is not intended to be limited by the numerical values shown in the above embodiment.

What is claimed is:

1. A switching signal modulation circuit comprising:
   a switching control circuit having an ON time control terminal and an OFF time control terminal, the switching control circuit capable of adjusting respectively separately ON time and OFF time of a switching signal using resistance values of resistors externally attached respectively to the ON time control terminal and the OFF time control terminal;
   a spread signal generating circuit operable to output a spread signal;
   an ON time setting resistor connected between the ground and the ON time control terminal of the switching control circuit;
   an OFF time setting resistor connected between the ground and the OFF time control terminal of the switching control circuit;
   a first weight resistor operable to vary the frequency and the duty of the switching signal, the first weight resistor connected between an output of the spread signal generating circuit and the ON time control terminal of the switching control circuit; and
   a second weight resistor operable to vary the frequency and the duty of the switching signal, the second weight resistor connected between the output of the spread signal generating circuit and the OFF time control terminal of the switching control circuit.

2. A switching signal modulation circuit according to claim 1, wherein the spread width of the frequency of the switching signal is determined by the ratio of the resistance value of the first weight resistor to that of the ON time setting resistor or by the ratio of the resistance value of the second weight resistor to that of the OFF time setting resistor, and wherein the variation rate of the duty of the switching signal is determined by the ratio of the resistance value of the first weight resistor to that of the second weight resistor.

3. A switching signal modulation circuit according to claim 1, wherein the switching control circuit controls turning on and off of a switching device of a switching regulator.

* * * * *